United States Patent [19]
MacFadden et al.

[11] 4,449,094
[45] May 15, 1984

[54] TEMPERATURE COMPENSATED MAGNETIC DAMPING ASSEMBLY FOR INDUCTION METERS

[75] Inventors: John A. MacFadden; Joseph M. Keever, both of Raleigh; William J. Zisa, Cary, all of N.C.

[73] Assignee: Westinghouse Electric Corp., Pittsburgh, Pa.

[21] Appl. No.: 272,244

[22] Filed: Jun. 10, 1981

[51] Int. Cl.³ ............... G01R 1/14; G01R 11/10; G01R 11/185
[52] U.S. Cl. .................. 324/152; 324/137; 335/217; 335/306
[58] Field of Search ............ 324/152, 137; 335/302, 335/306, 217, 207, 208

[56] References Cited

U.S. PATENT DOCUMENTS

| | | | |
|---|---|---|---|
| 3,688,192 | 8/1972 | Ramsey, Jr. | 324/137 |
| 3,895,328 | 7/1975 | Kato et al. | 335/208 |
| 3,903,492 | 9/1975 | Endo et al. | 335/208 |
| 4,238,729 | 12/1980 | MacFadden et al. | 324/152 |
| 4,325,042 | 4/1982 | Endo et al. | 335/208 |

FOREIGN PATENT DOCUMENTS

| | | |
|---|---|---|
| 804694 | 4/1951 | Fed. Rep. of Germany . |
| 1541779 | 8/1966 | Fed. Rep. of Germany . |
| 2142404 | 3/1973 | Fed. Rep. of Germany . |
| 2223161 | 9/1975 | Fed. Rep. of Germany . |

OTHER PUBLICATIONS

McQuarrie, "Improved Magnetic Retarding System for Watthour Meters" IEEE Transactions on Power Apparatus and Systems, May/Jun./1976, pp. 915-917.

*Primary Examiner*—Gerard R. Strecker
*Assistant Examiner*—Warren S. Edmonds
*Attorney, Agent, or Firm*—William D. Lanyi

[57] ABSTRACT

A temperature compensated magnetic damping assembly for providing a braking torque on an electroconductive disk of an induction device includes a pair of permanent magnets each having an easy axis of magnetization. Each permanent magnet provides two easy flux paths parallel to the easy axis of magnetization and separated by a dead zone. The permanent magnets are juxtaposed about a predetermined space through which the disk rotates such that the easy flux paths are perpendicular to the disk, and are aligned such that the magnetic flux passes twice through the disk in opposite directions. Flux return plates are provided adjacent to each of the permanent magnets so as to provide a flux path parallel to the disk and linking the two easy flux paths of each of the permanent magnets. In this configuration, a highly-efficient, substantially square magnetic flux loop is provided. One of the flux return plates is movable relative to the adjacent permanent magnet so as to provide series adjustment of the damping torque. Finally, a temperature sensitive magnetic shunting member extends from the north to the south pole, across the dead zone, of each of the permanent magnets so as to provide temperature compensation.

14 Claims, 8 Drawing Figures

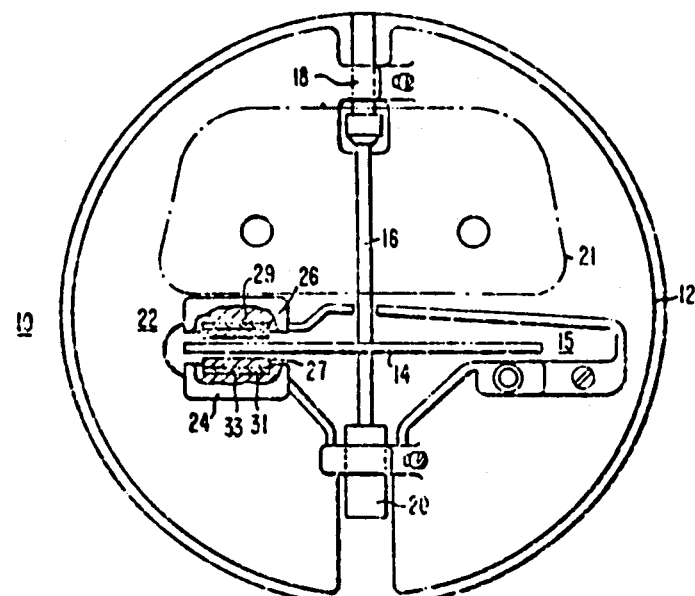
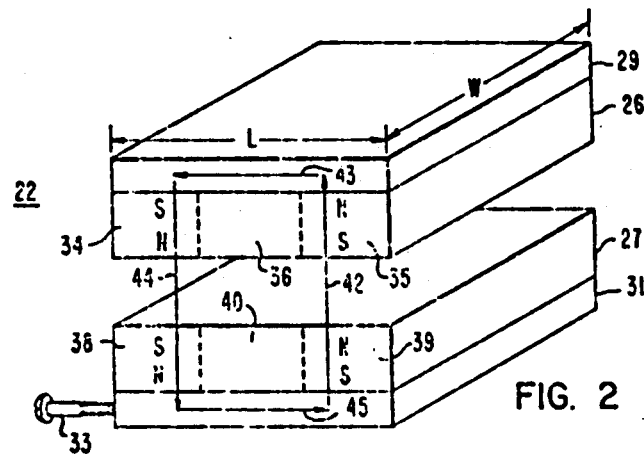

TEMPERATURE COMPENSATED MAGNETIC DAMPING ASSEMBLY FOR INDUCTION METERS

BACKGROUND OF THE INVENTION

1. Field of the Invention

This invention relates to a new and improved magnetic damping system for producing magnetic braking or retarding torque on a conductive disk of an induction device, and more particularly, to a damping system including a pair of highly coercive and anisotropic permanent magnets.

2. Description of the Prior Art

Magnetic braking for eddy current brake arrangements is commonly included in induction-type meter and relay devices, and in particular, in induction electromechanical watthour meters. An electromagnetic unit having voltage and current sections is typically included in induction watthour meters for connection between an electrical source and a load for measuring the consumption of AC electric energy. AC magnetic fields from the electromagnetic unit produce a driving torque on a rotatable armature formed by an electroconductive disk. Interaction between the changing magnetic fields and changing eddy currents induced in the disk by the fields develops a driving torque on the disk. Associated with the electroconductive disk is a permanent magnet brake or damping system for directing a magnetic field into the disk which induces eddy currents. The braking magnetic field reacts with the eddy currents to produce a retarding torque on the disk. The retarding torque is proportional to the disk speed for a given magnetic field and balances the disk driving torque. Thus, the disk speed is maintained accurately proportional to the electric power applied through the meter so that each disk rotation is representative of a predetermined quantum of electric energy consumption.

The braking magnetic flux is typically provided by permanent magnets which direct a flux through an air gap in which the electroconductive disk rotates. The strength of the permanent magnets, the position of the braking magnetic flux in relation to the disk center, the area and density of the braking flux entering the disk, and the length of the air gap determine the amount and consistency of the retarding torque. Maintaining the braking magnetic flux constant is a chief requirement. It is essential that the retarding torque that is produced by the damping assembly be kept proportional to the speed of the meter disk for accurate meter measurements. This becomes increasingly difficult due to the fact that the meter is exposed to widely-varying temperature and atmospheric changes. The meter is subjected to strong demagnetizing effects caused by electrical surges. Finally, substantial mechanical shock and vibration often occurs in shipping and handling of the meter.

The design of a magnetic damping system must incorporate the above and other factors in an assembly that is easy and simple to manufacture at minimum cost in accordance with high volume production techniques. Various magnetic damping systems are currently available which utilize a wide variety of configurations and various types of magnetic materials.

One such magnetic damping system is disclosed in U.S. Pat. No. 4,238,729. A high coercive magnet is vertically elongated and has a horizontal direction of magnetization which is parallel to the electroconductive disk. Flux concentrating pole pieces adjoin the magnetic pole faces for vertically directing two closely spaced braking magnetic fields from a pair of pole tips into the disk. Temperature compensation is provided by covering the sides of the permanent magnet between the edges of the pole pieces.

U.S. Pat. No. 4,182,984 is for a watthour meter damping assembly including a U-shaped magnetic yoke and a pair of highly-coercive and anisotropic permanent magnets projecting in a facing relationship from the ends of the yoke. The opposite pole faces of the magnets form an air gap in which the meter disk rotates. Temperature compensation is provided by a temperature compensator which extends over the pole faces of the permanent magnets to form a compensating shunt flux path around the air gap.

German Patentschrift No. 804,694 illustrates various methods using as many as four individual permanent magnets in a retaining frame which provides return flux paths. The retaining frame is constructed so as to expand and contract thereby varying the air gap to compensate for changes in the permanent magnets due to temperature variations.

Finally, U.S. Pat. No. 4,030,031 illustrates a magnetic damping system utilizing two permanent magnets, two magnetic bridge pieces, and two flux return paths to provide a substantially square magnetic flux path.

SUMMARY OF THE INVENTION

The present invention is a magnetic damping assembly for an induction device such as a watthour meter. A pair of highly coercive anisotropic thin permanent magnets is utilized to provide magnetic flux. Each of the magnets has an easy axis of magnetization. Each of the magnets provides two easy flux paths which are parallel to the easy axis of magnetization and which are separated by a dead zone. Thus, each magnet acts as two separate magnets each having a north and a south pole. The two magnets are juxtaposed about a predetermined space through which the electroconductive disk rotates. The magnets are oriented such that the easy paths of each of the magnets are perpendicular to the disk and aligned so that the magnetic flux passes twice through the disk in opposite directions.

A pair of flux return members are provided with one of the members being located adjacent to each of the permanent magnets. The flux return members are formed of a soft magnetic material so as to provide a flux path parallel to the disk and linking the two easy flux paths of each of the permanent magnets. In this configuration, a substantially square magnetic flux path is provided wherein no portion of the flux paths opposes the easy axis of magnetization of the two permanent magnets.

Since the two permanent magnets act as four individual magnets, efficient use of the permanent magnets is provided while simplifying the assembly process since only two, and not four, magnets must be positioned. This is true even though the portion of the permanent magnets forming the dead zone is not utilized to provide magnetic flux.

One of the flux return members is movable relative to the adjacent permanent magnet so as to vary the effective damping. This type of adjustment provides an efficient method of varying the damping force since the flux return member is a portion of the magnetic flux path. This type of series adjustment allows for greater variations in the damping than flux dispersion methods.

Finally, temperature compensation is provided by positioning a temperature compensating shunt extending from the north pole to the south pole, across the dead zone, of one or both of the permanent magnets.

BRIEF DESCRIPTION OF THE DRAWINGS

FIG. 1 is an elevational view with parts broken away of an induction watthour meter including a magnetic damping assembly made in accordance with the present invention;

FIG. 2 is a perspective view of the magnetic damping assembly illustrated in FIG. 1;

DESCRIPTION OF THE PREFERRED EMBODIMENT

Figure 3:
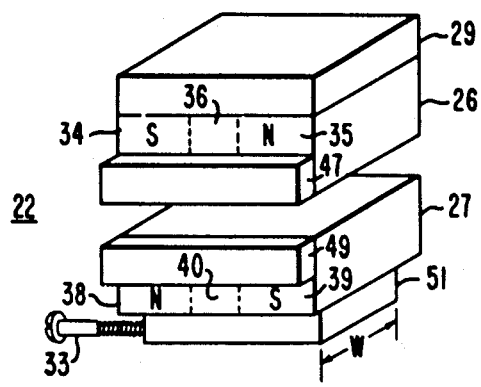
FIG. 3 is a perspective view of a temperature compensated magnetic damping assembly constructed according to the teachings of the present invention and utilizing a flux return plate having a width different than the width of the adjacent permanent magnet.

Referring to FIG. 1, an induction watthour meter including a frame 12 made of a non-magnetic die cast material such as aluminum for carrying the different parts of the meter movement is illustrated. The meter 10 is generally of a type having different meter parts as shown and described in U.S. Pat. No. 3,309,152. The aforementioned patent is incorporated by reference and may be referred to for a more detailed description of the meter which is briefly described hereinafter for a better understanding of the present invention. An electroconductive disk 14 is rotatable within an opening 15 in the meter frame 12. The disk 14 is carried on a vertical shaft 16 which is supported by an upper bearing support 18 and a lower bearing support 20. The upper and lower bearing supports 18 and 20, respectively, are carried by the frame 12 and are provided as disclosed in U.S. Pat. Nos. 3,693,086 and 3,810,683.

An electromagnetic unit (not shown) includes a voltage section having a voltage winding carried by an E-shaped laminated core and a current section including a pair of current coils and carried on a C-shaped laminated core. The voltage and current sections direct AC driving magnetic fluxes across an air gap of the electromagnetic unit and through the disk 14. A driving torque is produced in the disk 14 by the interaction of eddy currents with the driving magnetic fluxes inducing the eddy currents as is well understood in the art of watthour meters including the meter 10. The driving torque causes the disk 14 and the shaft 16 to rotate, which rotations are totalized by a dial register which is shown by broken lines 21 in outline form in FIG. 1. The dial register provides readings in kilowatthours of electrical energy consumption as is well understood in the art of watthour meters.

A magnetic damping assembly 22 constructed according to the teachings of the present invention is located in a housing 24 which is carried by the meter frame 12. The magnetic damping assembly 22 is comprised of a first permanent magnet 26 and a second permanent magnet 27 juxtaposed about the disk 14. The magnets are aligned such that the magnetic flux produced by the magnets 26 and 27 passes twice through the disk 14 in opposite directions. This damping or braking magnetic flux produces eddy currents which interact with the damping flux to provide a retarding torque. The retarding magnetic torque produced by the magnetic damping assembly 22 counterbalances the driving torque so that the rotation of the disk 14 and shaft 16 remains proportional to the consumption of electrical energy to be measured by the meter 10.

Completing the description of the magnetic damping assembly 22, a first flux return plate 29 is located adjacent to the first permanent magnet 26 and a second flux return plate 31 is located adjacent to the second permanent magnet 27. A full load adjustment screw 33 is provided for varying the position of the second flux return plate 31. The description of the construction and operation of the magnetic damping assembly 21 is continued hereinafter beginning with FIG. 2.

Turning to FIG. 2, a perspective view of the magnetic damping assembly 22 of FIG. 1 is shown. The magnets 26 and 27 are thin, high coercive, anisotropic permanent magnets. Each of the permanent magnets 26 and 27 has an easy axis of magnetization and is oriented such that the easy axis of magnetization is perpendicular to the electroconductive disk 14 (not shown in FIG. 2). Because of the geometry of the permanent magnets 26 and 27, each magnet provides two easy flux paths parallel to the easy axis of magnetization which are separated by a dead zone. The two flux paths define individual north and south poles such that each permanent magnet 26 and 27 acts as two individual magnets. The first permanent magnet 26 acts as a first bar magnet 34 and a second bar magnet 35 separated by a dead zone 36. Similarly, the second permanent magnet 27 acts as a third bar magnet 38 and a fourth bar magnet 39 separated by a dead zone 40. This results in several advantages. Because of the orientation and location of the first and second permanent magnets 26 and 27, the magnetic flux produced by each magnet passes twice through the disk 14. Second, the first and second permanent magnets 26 and 27 act as four individual magnets without the assembly problems of having to actually position four individual magnets. Finally, the magnetic flux path is substantially parallel to the easy axis of magnetization such that the most efficient flux paths possible are used. These advantages outweigh the disadvantage of having certain of the magnetic material not being utilized by being in the dead zones 36 and 40.

Various high coercive anisotropic materials are available which may be utilized for the thin permanent magnets 26 and 27. Such materials include ALNICO 8, ALNICO 9, ALNICO 12, CERAMIC 8, rare earth and other magnetic materials.

Continuing with the description of FIG. 2, the first flux return plate 29 and the second flux return plate 31 are positioned so as to provide a return flux path parallel to the disk and linking the two easy flux paths of each of the permanent magnets 26 and 27. Proper machining of the flux return plates 29 and 31 is necessary to assure an intimate magnetic contact therebetween so as to minimize leakage flux and magnetomotive force loss. In the embodiment shown in FIG. 2, the flux return plates 29 and 31 have the same length and width as the first and second permanent magnets 26 and 27, respectively. This identity of dimension is not required by the present invention as will be seen from the description of FIGS. 3 and 5. The flux return plates 29 and 31 are made of a high permeability magnetic material, such as iron or low carbon steel, so as to provide an easy flux path. As can be seen by the arrows 42, 43, 44 and 45, the complete damping assembly 22 provides a substantially square magnetic flux loop. This is advantageous since those portions of the flux loop within the permanent magnets 26 and 27 are substantially parallel to the easy axis of magnetization thereby utilizing the permanent magnets most efficiently.

Finally, the full load adjustment screw 33 is used to vary the position of the second flux return plate 31 relative to the second permanent magnet 27. By varying the position of the second flux return plate 31, the amount of magnetic flux linked between the north pole of the third bar magnet 38 and the south pole of the fourth bar magnet 39 is varied. This provides an efficient method of varying the damping flux since the second flux return plate 31 is a portion of the magnetic flux loop. This type of series adjustment provides for a greater range from minimum to maximum damping than is typically provided by parallel adjustment methods. Additionally, because of the low leakage flux of this embodiment, it is necessary to have a member in the magnetic flux loop, rather than parallel with the magnetic flux loop, to provide the necessary adjustment range. This concludes the description of FIG. 2.

FIG. 3 illustrates an alternative embodiment of the present invention. Identical components have identical reference numerals. FIG. 3 also illustrates magnetic shunting members 47 and 49 which are used for temperature compensation. Similar magnetic shunting members are used in conjunction with the embodiment shown in FIG. 2, but have not been shown therein so as to be able to illustrate the north and south poles and the magnetic flux loop. In FIG. 3, the shunting member 47 extends from the north pole of the first bar magnet 34 to the south pole of the second bar magnet 35 across the dead zone 36 of the first permanent magnet 26. In a similar fashion, the second shunting member 49 extends from the south pole of the third bar magnet 38 to the north pole of the fourth bar magnet 39 across the dead zone 40 of the second permanent magnet 27. The shunting members 47 and 49 are made of a magnetic material having a negative temperature coefficient such as nickel steel. The shunting members provide a flux path for leakage flux which passes or shunts an amount of flux which varies with temperature so as to keep a constant gap flux over a wide range of temperatures. When used with permanent magnet materials having extremely low leakage fluxes, such as rare earth magnets, the effectiveness of the shunting members 47 and 49 is decreased. This decrease in effectiveness may be overcome by increasing the number of shunting members.

Figure 4:
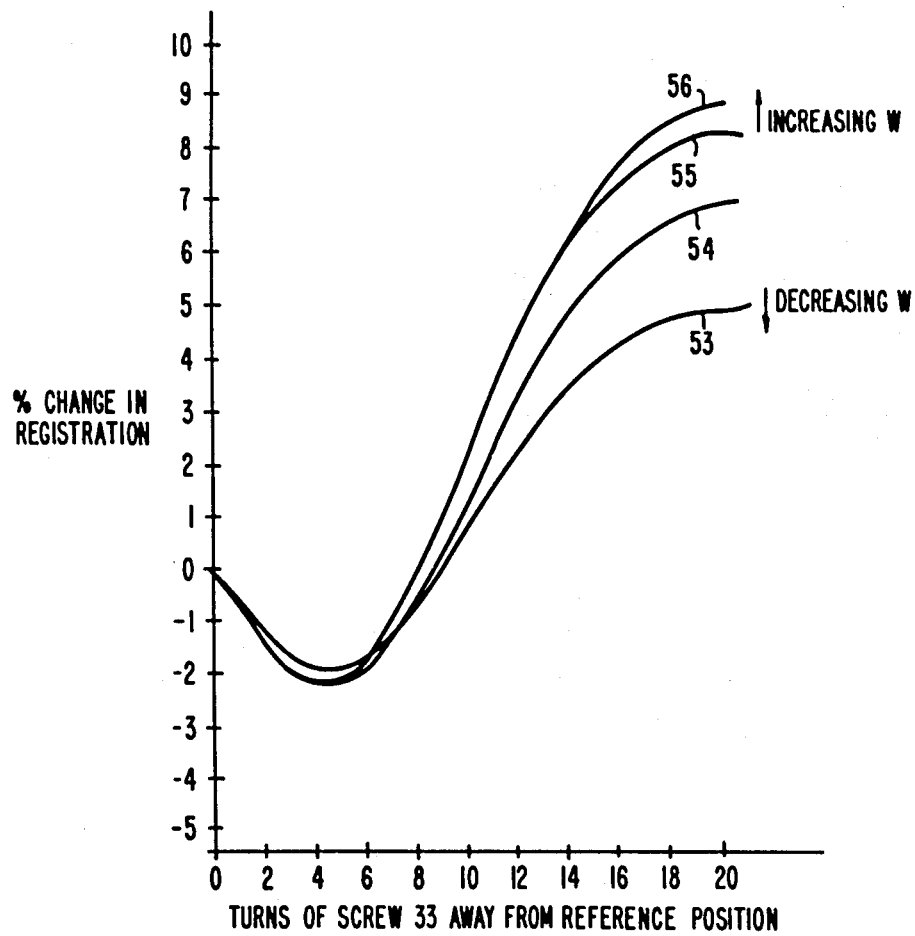
FIG. 4 is a graph illustrating the percent change in registration versus the turns of the full load screw away from a reference position for the temperature compensated magnetic damping assembly of FIG. 3 for various flux return plate widths.

In FIG. 3, a second flux return plate 51 has a length somewhat less than the length of the second permanent magnet 27 and a width less than the width of the second permanent magnet 27. FIG. 4 illustrates the percent change in registration of the meter 10 as a function of the turns of the full load screw 33 away from the reference position shown in FIG. 3. The four curves of FIG. 4 are produced by varying the width of the second flux return plate 51. The table below summarizes the dimensions used in order to produce the curves of FIG. 4.

TABLE I

| PART | | LENGTH | WIDTH | THICKNESS |
| --- | --- | --- | --- | --- |
| Magnet 26 | | .750 (1.905 cm) | .600 (1.524 cm) | .250 (.635 cm) |
| Plate 29 | | .750 (1.905 cm) | .600 (1.524 cm) | .150 (.381 cm) |
| Magnet 27 | | .750 (1.905 cm) | .600 (1.524 cm) | .250 (.635 cm) |
| Plate 51 | (curve 53) | .500 (1.27 cm) | .300 (.762 cm) | .200 (.508 cm) |
| | (curve 54) | .500 (1.27 cm) | .400 (1.016 cm) | 200 (.508 cm) |
| | (curve 55) | .500 (1.27 cm) | .500 (1.27 cm) | .200 (.508 cm) |
| | (curve 56) | .500 (1.27 cm) | .600 (1.524 cm) | .200 (.508 cm) |

All dimensions are in inches.

Figure 5:
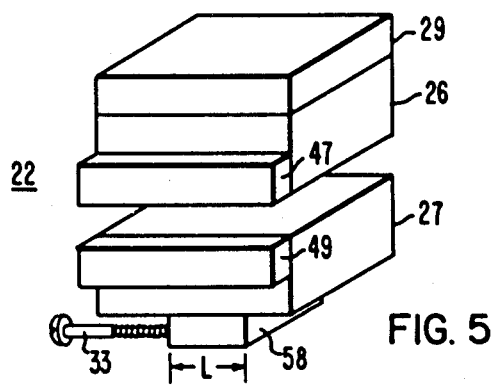
FIG. 5 is a perspective view of a temperature compensated magnetic damping assembly constructed according to the features of the present invention utilizing a flux return plate having a different length than the length of the adjacent permanent magnet.
Figure 6:
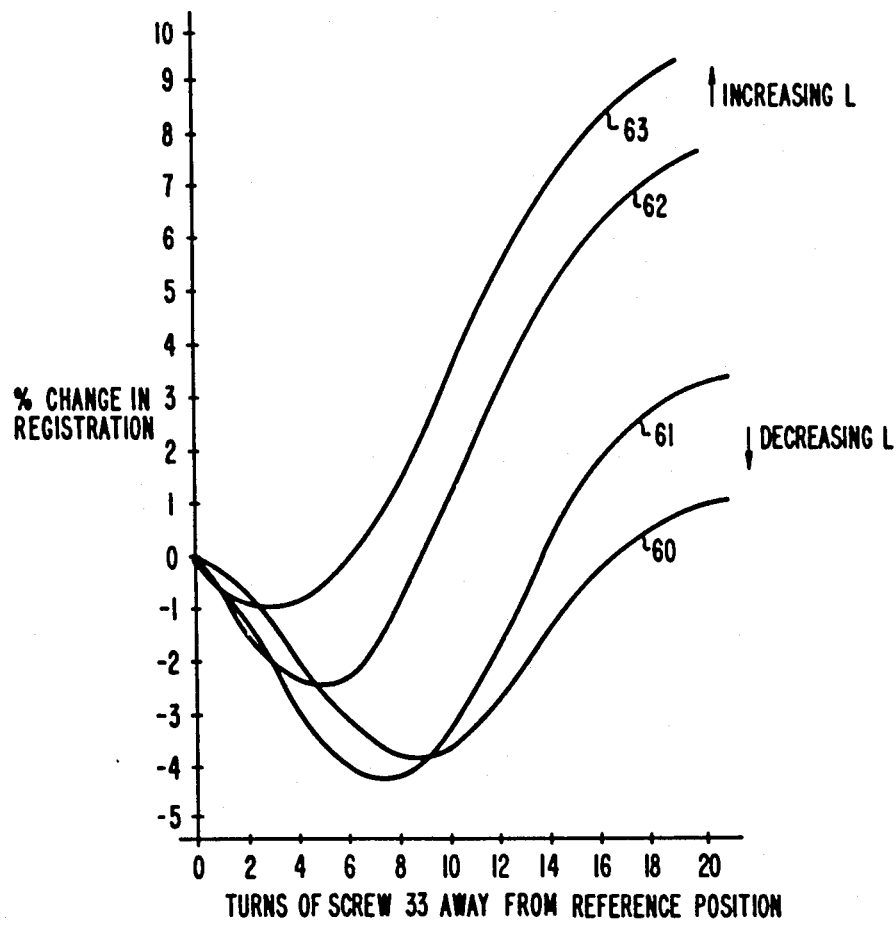
FIG. 6 is a graph illustrating the percent change in registration versus the turns of the full load screw away from a reference position for the temperature compensated magnetic damping assembly of FIG. 5 for various flux return plate lengths.

An alternative embodiment of the magnetic damping assembly 22 is shown in FIG. 5. Identical components have identical reference numerals. The first and second permanent magnets 26 and 27 and the first flux return plate 29 have the same dimensions as the corresponding components illustrated in FIG. 3. A second flux return plate 58 has a width of 0.600 inches (1.524 cm) and a thickness of 0.150 inches (0.381 cm). FIG. 6 is a graph illustrating the percent change in registration versus the turns of the full load screw 33 away from the reference position shown in FIG. 5 for various lengths of the second flux return plate 58. Curve 60 corresponds to a length of 0.300 inches (0.762 cm). Curves 61, 62 and 63 correspond to lengths of 0.400 inches (1.016 cm), 0.500 inches (1.27 cm) and 0.600 inches (1.524 cm), respectively.

Figure 7:
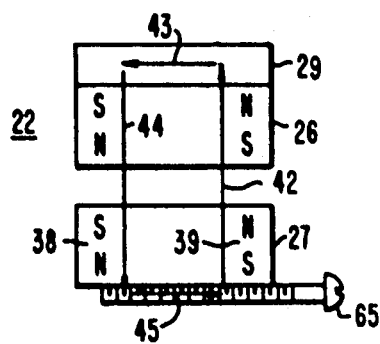
FIG. 7 is a cross-sectional view of a magnetic damping assembly constructed according to the teachings of the present invention and utilizing a steel screw in place of a flux return plate.
Figure 8:
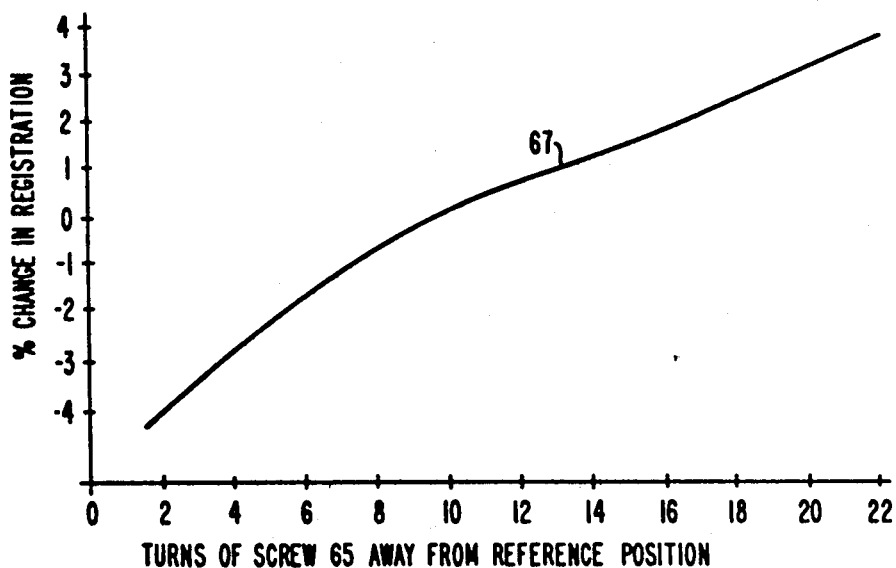
FIG. 8 is a graph illustrating the percent change in registration versus the turns of the full load screw away from a reference position for the magnetic damping assembly of FIG. 7.

FIG. 7 illustrates a cross-sectional view of an alternative embodiment of the present invention. Identical components have identical reference numerals. In FIG. 7, the second flux return plate has been replaced by a flux return screw 65. The flux return screw 65 forms a portion of the magnetic loop as illustrated by the arrows 42, 43, 44 and 45. Varying the location of the screw 65 determines how much of the flux from the third bar magnet 38 will be linked with the flux of the fourth bar magnet 39. In FIG. 7, the first bar magnet 26, the second bar magnet 27, and the first flux return plate 29 have the same dimensions as the corresponding components in FIG. 3. The flux return screw 65 is formed of a soft magnetic material so as to provide a good flux path. FIG. 8 illustrates a curve 67 which represents the percent change in registration versus the turns of the flux return screw 65 away from the reference position shown in FIG. 7. It is anticipated that additional embodiments of the present invention may be devised which fall within the spirit and scope of the following claims.

What we claim is:

1. A magnetic damping assembly for an induction device magnetically driving an electroconductive disk, said assembly comprising:

a pair of permanently magnetized pieces each having an easy axis of magnetization, each of said pieces being made of an anisotropic material, said pieces each having two magnetized regions of opposite polarity, said regions providing two easy flux paths parallel to said easy axis of magnetization and separated by a dead zone of unmagnetized anisotropic material, said pieces being juxtaposed about a predetermined space through which said disk rotates such that said easy flux paths of each of said pieces are perpendicular to said disk and aligned so that the magnetic flux passes twice through said disk in opposite directions;

a pair of flux return members formed of a soft magnetic material, one of said members being located adjacent to each of said pieces so as to provide a flux path parallel to said disk and linking said two easy flux paths; and means for varying the position of at least one of said flux return members relative to said piece so as to vary the magnetic flux linked between said two easy flux paths of said piece thereby varying the damping.

2. The assembly of claim 1 wherein said pair of permanently magnetized pieces includes two thin magnets formed of a high energy high coercive material.

3. The assembly of claim 2 wherein said high energy high coercive material includes ALNICO 8.

4. The assembly of claim 2 wherein said high energy high coercive material includes ALNICO 9.

5. The assembly of claim 2 wherein said high energy high coercive material includes ALNICO 12.

6. The assembly of claim 2 wherein said high energy coercive material includes CERAMIC 8.

7. The assembly of claim 2 wherein said high energy high coercive material includes rare earths.

8. The assembly of claim 2 further comprising at least one temperature compensating flux shunt member extending between a north and a south pole, across said dead zone, of one of the thin magnets.

9. The assembly of claim 1 wherein said pair of flux return members includes two flat plates.

10. The assembly of claim 9 wherein said movable flat plate has dimensions smaller than the dimensions of the adjacent piece, and wherein said means for varying said position includes a screw.

11. The assembly of claim 1 wherein said movable flux return member includes a screw.

12. The assembly of claim 1 wherein said soft magnetic material includes steel.

13. A magnetic damping assembly for an induction device magnetically driving an electroconductive disk, said assembly comprising:

a pair of permanently magnetized pieces of anisotropic material, each of said pieces having an easy axis of magnetization, said pieces each having two magnetized regions of opposite polarity, said regions providing two easy flux paths parallel to said easy axis of magnetization and separated by a dead zone of unmagnetized anisotropic material, each of said easy flux paths defining a north and a south pole, said pieces being juxtaposed about a predetermined space through which said disk rotates such that said easy flux paths of each of said pieces are perpendicular to said disk and aligned so that the magnetic flux passes twice through said disk in opposite directions;

a pair of flux return plates formed of a soft magnetic material, one of said plates being located adjacent to each of said pieces so as to provide a series flux path parallel to said disk and linking said two easy flux paths; and means for varying the position of at least one of said flux return plates relative to said adjacent piece so as to vary the magnetic flux linked between said two easy flux paths of said piece thereby varying the damping; and at least one temperature compensating member extending between said north and said south poles, across said dead zone, of one of said pieces thereby providing a shunt flux path, said temperature compensating member having a permeability that varies with temperature.

14. A permanent magnet assembly, comprising:

two pieces of anisotropic magnetic material, each of said pieces comprising two magnetized regions of opposite polarity with an unmagnetized dead zone therebetween, said pieces being disposed in cooperative association to define a gap between them, said two magnetized regions of said two pieces being associated to define two positions within said gap, each of said positions having magnetized regions of opposite polarity disposed proximate each other on opposing sides of said gap;

a first flux return member disposed adjacent to a first one of said two pieces, said first one piece being disposed between said first flux return member and said gap, said first flux member providing a flux path between said two magnetized regions of said first one piece;

a second flux return member disposed adjacent to a second one of said two pieces, said second one piece being disposed between said second flux return member and said gap, said second flux return member providing a flux path between said two magnetized regions of said second one piece; and means for moving said second flux return method in relation to said second piece in a direction parallel to said gap.

* * * * *